United States Patent
Nulman

(10) Patent No.: US 6,572,321 B1
(45) Date of Patent: Jun. 3, 2003

(54) LOADER CONVEYOR FOR SUBSTRATE PROCESSING SYSTEM

(75) Inventor: Jaim Nulman, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/684,142

(22) Filed: Oct. 5, 2000

(51) Int. Cl.⁷ ............................................. B65G 1/133
(52) U.S. Cl. ................... 414/416.05; 414/940; 414/810
(58) Field of Search .................. 414/935, 936, 414/937, 940, 941, 217, 416.05, 416.08

(56) References Cited

U.S. PATENT DOCUMENTS

| 4,392,553 A | * | 7/1983 | Foster | 186/61 |
|---|---|---|---|---|
| 4,793,262 A | | 12/1988 | Horn | |
| 5,338,945 A | * | 8/1994 | Baliga et al. | 414/217 |
| 5,417,537 A | * | 5/1995 | Miller | 414/217 |
| 5,449,091 A | * | 9/1995 | Dalziel | 221/81 |
| 5,711,646 A | * | 1/1998 | Ueda et al. | 414/225 |
| 5,935,330 A | * | 8/1999 | Taniguchi | 118/66 |
| 6,026,561 A | * | 2/2000 | Lafond | 29/722 |
| 6,035,971 A | * | 3/2000 | Lindstrom et al. | 186/61 |
| 6,042,324 A | * | 3/2000 | Aggarwal et al. | 414/411 |
| 6,082,951 A | | 7/2000 | Nering et al. | |
| 6,095,054 A | * | 8/2000 | Kawano et al. | 104/139 |
| 6,109,323 A | * | 8/2000 | Baccini | 156/362 |

* cited by examiner

Primary Examiner—Eileen D. Lillis
Assistant Examiner—Charles A. Fox
(74) Attorney, Agent, or Firm—Dugan & Dugan LLP

(57) ABSTRACT

A loader conveyor adapted so as to receive a wafer carrier from a transfer conveyor and adapted to terminate at an intersection with a processing system, is provided. Thus, the need for a front-end loader robot may be eliminated.

10 Claims, 14 Drawing Sheets

LOADER CONVEYOR FOR SUBSTRATE PROCESSING SYSTEM

FIELD OF THE INVENTION

The present invention relates to a method and apparatus for transferring objects, and specifically to an improved method and apparatus for the automated transfer of semiconductor substrates to a processing tool.

BACKGROUND OF THE INVENTION

A factory for manufacturing semiconductor substrates (e.g., patterned or unpatterned wafers) is conventionally known as a "FAB." Within the FAB, a transfer conveyor transports semiconductor wafers in what is known as a wafer carrier (e.g., a sealed pod, a cassette, a container, etc.) between various processing systems, wherein a wafer carrier is placed on a mechanism known as a load port (i.e., a mechanism which supports a wafer carrier while wafers are extracted from the wafer carrier and transported into a processing system coupled thereto). Typically, either an operator or a front-end robot employs complex multi-axis movement to transfer a wafer carrier between the transfer conveyor and the load port. The complex multi-axis movement required for the front-end loader robot to transfer a wafer carrier between the transfer conveyor and the load port increases equipment expense and reduces equipment reliability.

Further, the semiconductor industry is increasing the number of devices which can be produced on a single wafer. Thus, wafer sizes are larger (e.g., 300 mm), which increases the weight of a loaded wafer carrier, and makes manual transfer more difficult.

Accordingly, there is a need for an improved system which receives wafer carriers from a transfer conveyor and transfers the wafer carriers to a load port.

SUMMARY OF THE INVENTION

The present invention provides an inventive loader conveyor adapted so as to receive a wafer carrier from a transfer conveyor and transfer the wafer carrier to a load port. The inventive loader conveyor is adapted to terminate at an intersection with a processing system. The inventive loader conveyor may comprise an extension mechanism adapted to selectively extend and retract so as to receive a wafer carrier from a transfer conveyor and transfer the wafer carrier to a load port and/or so as to provide space between the transfer conveyor and the load port as needed for human access, for maintenance or for any other purpose. The inventive loader conveyor eliminates the need for the front-end loader robot which, in turn, reduces equipment expense and increases equipment reliability.

Other features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
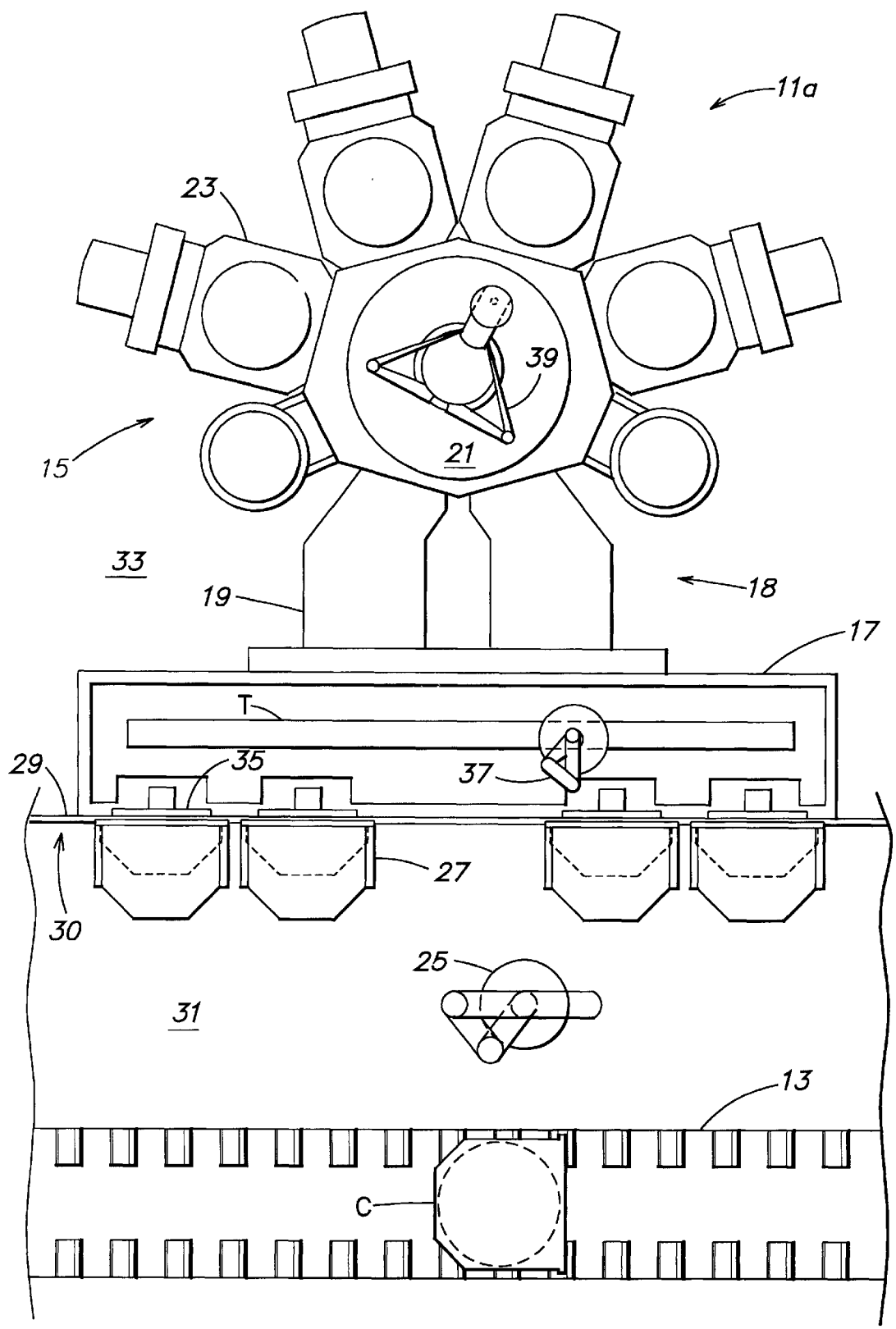
FIG. 1 is a schematic top plan view, in pertinent part, of a conventional FAB, showing a transfer conveyor which transports wafers contained in wafer carriers (e.g., a sealed pod, a cassette, a container, etc.) between various processing systems.

FIG. 1 is a schematic top plan view, in pertinent part, of a conventional FAB 11a, showing a transfer conveyor 13 which transports wafers contained in wafer carriers C (e.g., a sealed pod, a cassette, a container, etc.) between various processing systems 15. The exemplary processing system 1s shown in FIG. 1 includes an interface chamber 17 and a processing tool 18 comprising a pair of loadlock chambers 19, a transfer chamber 21 coupled to the loadlock chambers 19, and a plurality of processing chambers 23 coupled to the transfer chamber 21.

A front-end robot 25 is adapted to transfer wafer carriers C between the transfer conveyor 13 and a plurality of load ports 27 coupled to the interface chamber 17. An interface wall 29 is positioned at an intersection 30 between the load ports 27 and the processing system 15 for separating a "white area" clean room 31 from a less clean, "gray area" clean room 33. The load ports 27 are located in the "white area" clean room 31 and the processing system 15 is located in the less clean, "gray area" clean room 33. The load ports 27 are positioned adjacent sealable openings 35 in the interface wall 29 and may provide a wafer carrier door receiver (not shown) adapted to engage and unlatch a door portion of a sealed wafer carrier as is known in the art.

The interface chamber 17 contains an interface wafer handler 37 mounted to a track T and adapted to transport wafers between the load ports 27 and the loadlock chambers 19. The transfer chamber 21 of the processing tool 18 contains a transfer wafer handler 39 adapted to transport wafers (not shown) between the loadlock chambers 19 and the processing chambers 23.

In operation, the front-end loader robot 25 employs a complex multi-axis, rotary movement to transfer a wafer carrier C between the transfer conveyor 13 and the load ports 27. Assuming the wafer carrier C is a sealed carrier, at the load port 27, a wafer carrier door receiver (not shown) engages and unlatches the door portion of the sealed wafer carrier. The interface wafer handler 37 of the interface chamber 17 then extracts a wafer from the wafer carrier C and transports the wafer to one of the loadlock chambers 19. Thereafter, the transfer wafer handler 39 of the processing tool 18 transports the wafer from the loadlock chamber 19 to a processing chamber 23 wherein a processing step is performed on the wafer.

As previously stated, the complex multi-axis movement required for the front-end loader robot 2 to transfer a wafer carrier C between the transfer conveyor 13 and a load port 27 increases equipment expense and reduces equipment reliability. Accordingly, the present inventor has developed an improved system which receives wafer carriers C from the transfer conveyor 13 and transfers the wafer carriers C to a load port 27 as described below with reference to FIGS. 2A–4C.

Figure 2A:
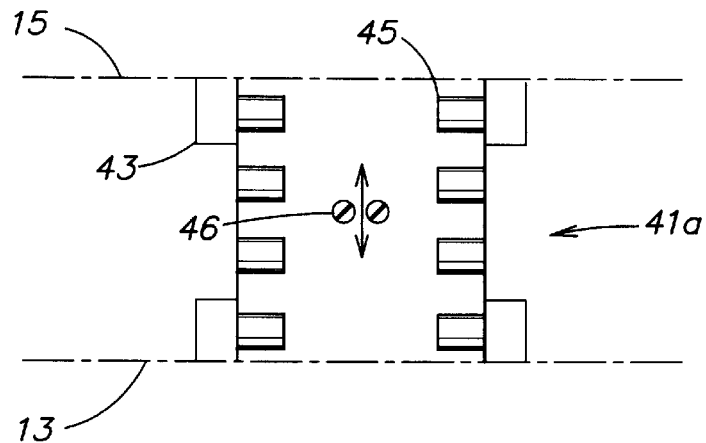
FIG. 2A is a schematic top plan view of an inventive loader conveyor adapted so as to receive a wafer carrier from the transfer conveyor and transfer the wafer carrier C to the load port.

FIG. 2A is a schematic top plan view of an inventive loader conveyor 41a adapted so as to receive a wafer carrier C from the transfer conveyor 13 (FIG. 1) and transfer the wafer carrier C to the load port 27 (FIG. 1). The inventive loader conveyor 41a is adapted to couple, preferably via connecting mechanisms 43 (e.g., hooks, optical sensors, etc.), to the transfer conveyor 13 and/or to a processing system 15 (FIG. 1) such that a wafer carrier C may be transported therebetween as described below with reference to FIG. 2C. Specifically, the inventive loader conveyor 41a is adapted to terminate at the intersection 30 with a processing system 15, so as to function as a load port 27. The inventive loader conveyor 41a preferably comprises a plurality of rolling elements 45 adapted to transport a wafer carrier C therealong, such that the carrier is positioned on the rollers by gravity and rotation of the rollers causes linear movement of the carrier positioned thereon.

The inventive loader conveyor 41a optionally may include conventional locking mechanisms 46 which secure a wafer carrier C in place thereon so as to ensure that the wafer carrier C does not move with respect to the loader conveyor 41a during the wafer extraction process. As described further with reference to FIGS. 3A–D, the inventive loader conveyor 41a optionally may also include a sensor 47 (FIG. 3C) which detects when the inventive loader conveyor 41a is properly coupled to the transfer conveyor 13 and/or which detects that a conventional turntable portion (FIGS. 3A–D) of the transfer conveyor 13 is in proper position to transfer a wafer carrier C to the inventive loader conveyor 41a from the transfer conveyor 13.

Figure 2B:
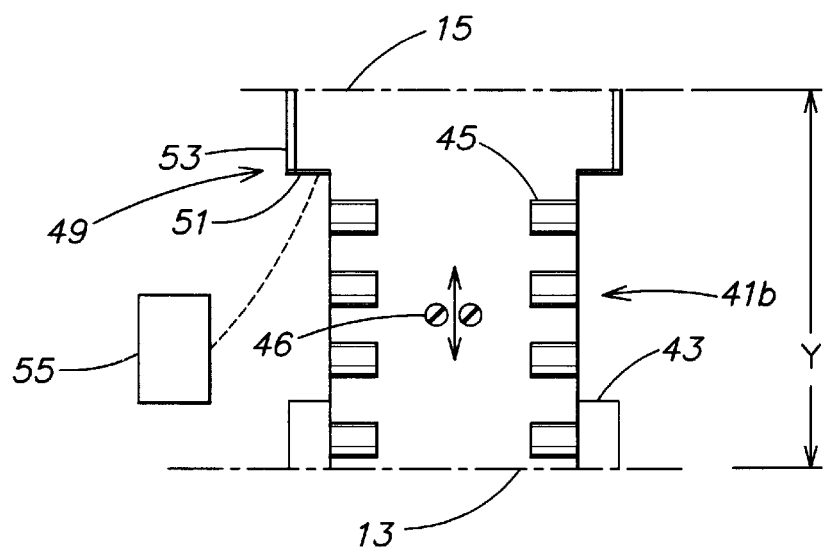
FIG. 2B is a schematic top plan view of a second embodiment of an inventive loader conveyor.

FIG. 2B is a schematic top plan view of a second embodiment of an inventive loader conveyor 41b. The inventive loader conveyor 41b of FIG. 2B comprises an extension mechanism 49, adapted to selectively extend and retract so as to receive a wafer carrier C from a transfer conveyor 13 and transfer the wafer carrier C to a load port 27 (FIG. 1) and/or so as to provide space between the transfer conveyor 13 and the load port 27 as needed for human access, for maintenance or for any other purpose. The inventive loader conveyor 41b is adapted to couple, preferably via connecting mechanisms 43, to the transfer conveyor 13 and/or to a processing system 15 (FIG. 1) such that a wafer carrier C may be transported therebetween as described below with reference to FIG. 2C. The inventive loader conveyor 41b may comprise the same components as the inventive loader conveyor 41a of FIG. 2A, with the addition of the extension mechanism 49.

The extension mechanism 49 comprises a pair of arms 51, each arm 51 is slideably coupled to a track 53. The pair of arms 51 may selectively extend and retract between the transfer conveyor 13 and the processing system 15, as described further with reference to FIGS. 4A–C. A controller 55 is coupled to the pair of arms 51 for controlling the extension and retraction thereof.

Figure 2C:
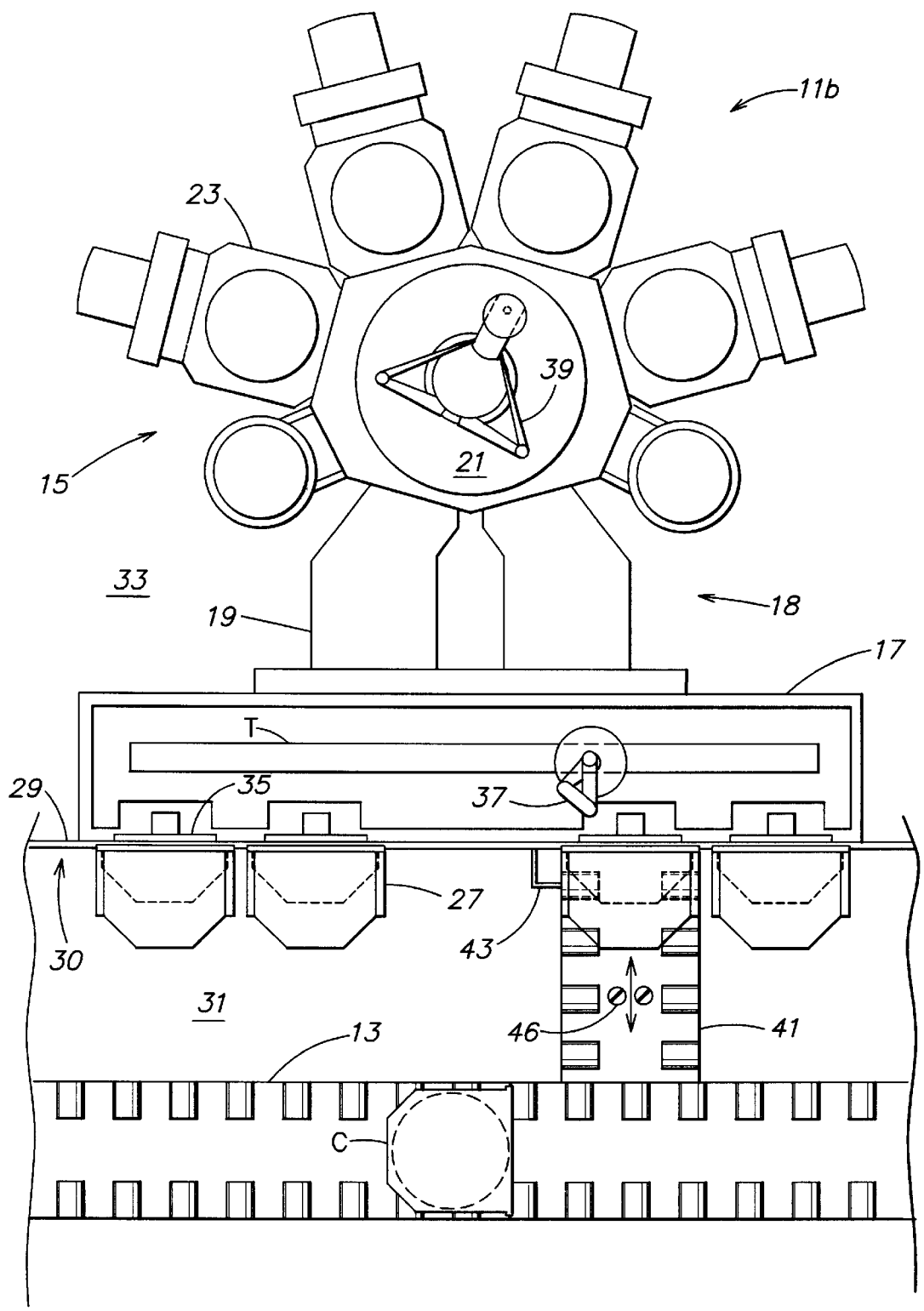
FIG. 2C is a schematic top plan view, in pertinent part, of the FAB, having an inventive loader conveyor of FIGS. 2A–B coupled, via the connecting mechanisms, to a transfer conveyor and to a processing system such that a wafer carrier maybe transported therebetween.

FIG. 2C is a schematic top plan view, in pertinent part, of the FAB 11b, having the inventive loader conveyor 41 (i.e., 41a or 41b of FIGS. 2A–B) coupled, via the connecting mechanisms 43, to a transfer conveyor 13 and to a processing system 15 (FIG. 1) such that a wafer carrier C maybe transported therebetween. The FAB 11b may comprise the same components as the FAB 11a of FIG. 1 with the addition of the inventive loader conveyor 41a of FIG. 2A and the elimination of the front-end loader robot 25 of FIG. 1.

Each of the inventive loader conveyors 41a, 41b eliminates the need for the front-end loader robot 25 (FIG. 1) which, in turn, reduces equipment expense and increases equipment reliability, as further described below.

FIGS. 3A–D are schematic top plan views of an inventive conveyor load port 57a, having the inventive loader conveyor 41a of FIG. 2A coupled thereto and adapted so as to receive a wafer carrier C from a transfer conveyor 13 and transfer the wafer carrier C to an intersection 30 with a processing system 15, wherein the interface wafer handler 37 (FIG. 1) may extract wafers from the wafer carrier C and transport the wafers to the processing tool 18. The inventive conveyor load port 57a is coupled to the transfer conveyor 13, preferably via the connecting mechanisms 43 or via being positioned sufficiently close to the transfer conveyor 13 so as to exchange wafer carriers C therewith, and terminates at the intersection 30 with the processing system 15.

The conventional transfer conveyor 13 has a turntable portion 63 adapted to rotate (e.g., by 90 degrees), from an "initial" position wherein the turntable portion 63 can transport the wafer carrier C in a first direction as indicated by arrow A to a "transfer conveyor coupling position" wherein the turntable portion 63 can transport the wafer carrier C in a second direction as indicated by arrow B. Preferably, the transfer conveyor 13, including the turntable portion 63, comprises a plurality of rolling elements 65 like the rolling elements 45 of the inventive loader conveyor 41a, 41b so as to ensure smooth transfer of the wafer carrier C between the transfer conveyor 13 and the inventive loader conveyor 41a, 41b. Preferably, the turntable portion 63 comprises a sensor 66 which detects that a wafer carrier C is properly in place thereon. A suitable transfer conveyor 13 is described in U.S. Pat. No. 4,793,262 issued Dec. 27, 1988.

As described above with reference to FIG. 2A, the inventive loader conveyor 41a optionally may also include the sensor 47 (FIG. 3C) which detects when the inventive loader conveyor 41a is properly coupled to the transfer conveyor 13 and/or which detects that the turntable portion 63 is in proper position to transfer a wafer carrier C to the inventive loader conveyor 41a from the transfer conveyor 13. The sensor 47 may comprise a mechanical sensor, an electromechanical sensor, or an electromagnetic sensor.

The sensor 47, in one aspect, comprises an emitter 69 (e.g., light emitting diode) and a receiver 71 (e.g., photocell). The emitter 69 is shown coupled to the inventive loader conveyor 41a and the receiver 71 is shown coupled to the turntable portion 63 of the transfer conveyor 13 in FIGS. 3A–D. The emitter 69 and the receiver 71 are positioned so that a signal sent by the emitter 69 is detected by the receiver 71 only when the turntable portion 63 is in the "transfer conveyor coupling position," (e.g., in this position the emitter 69 and the receiver 71 may be in line). The controller 55 may be programmed such that the turntable portion 63 may transfer the wafer carrier C to the inventive loader conveyor 41a, 41b only when the receiver 71 detects the signal from the emitter 69.

Figure 3A:
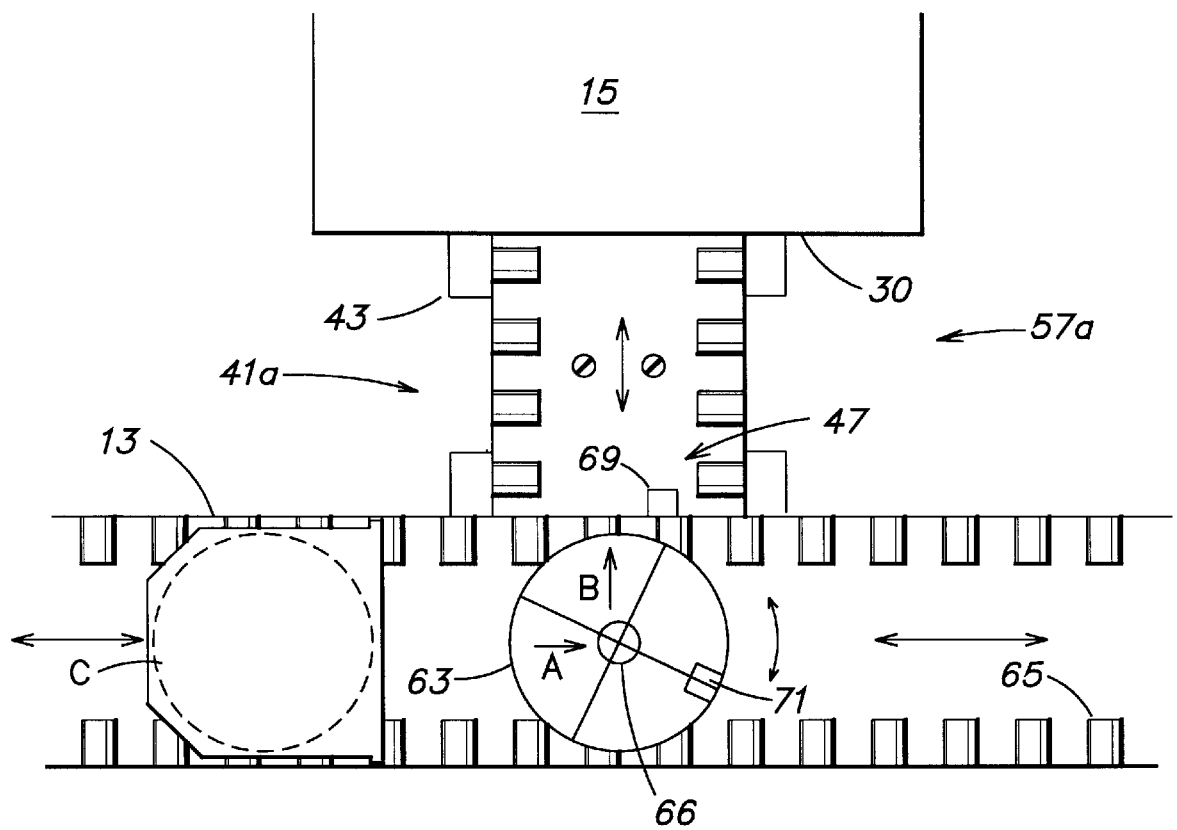
FIGS. 3A–D are schematic top plan views of an inventive conveyor load port, having the inventive loader conveyor of FIG. 2A coupled thereto and adapted so as to receive a wafer carrier from a transfer conveyor and transfer the wafer carrier to an intersection with a processing system, wherein the interface wafer handler may extract wafers from the wafer carrier and transport the wafers to the processing tool.
Figure 3B:
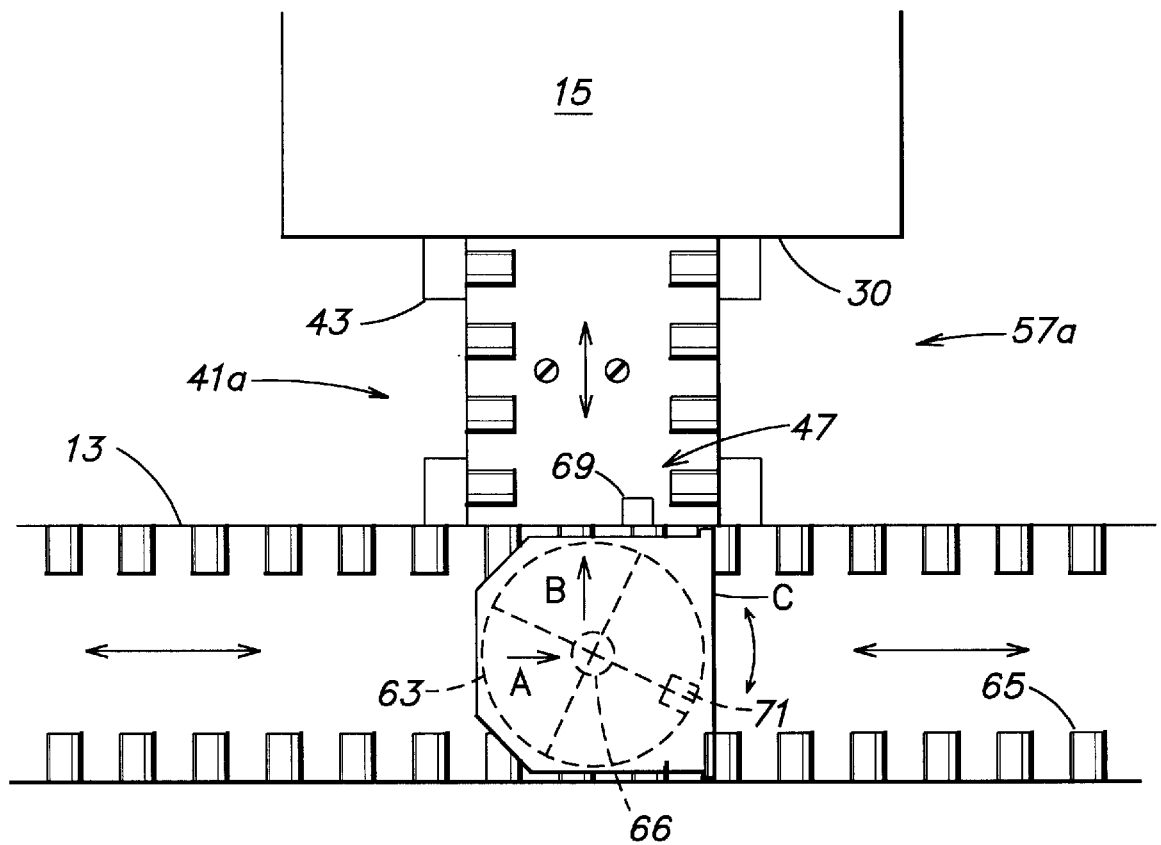

The operation of the inventive conveyor load port 57a, having the inventive loader conveyor 41a of FIG. 2A, is described with reference to the sequential views of FIGS. 3A–D, which show the movement of the wafer carrier C between the transfer conveyor 13 and the inventive loader conveyor 41a. FIG. 3A shows the wafer carrier C, positioned on the transfer conveyor 13, prior to reaching the turntable portion 63. The rolling elements 65 of the transfer conveyor 13 roll, transporting the wafer carrier C onto the turntable portion 63. As shown in FIG. 3B, the turntable portion 63 is in an "initial" position and the wafer carrier C is positioned thereon. In the "initial" position, the receiver 71 does not receive the signal from the emitter 69, as the receiver 71 and emitter 69 are not aligned.

Figure 3C:
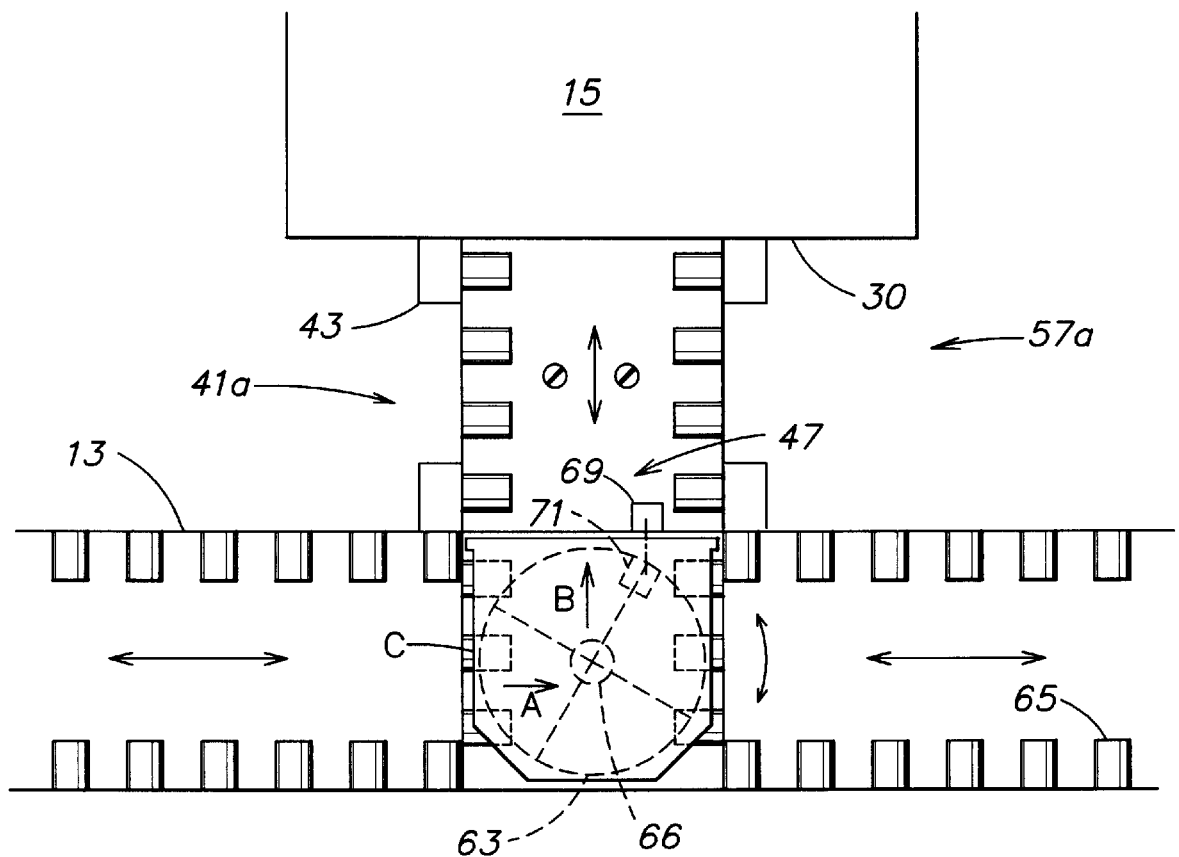
Figure 3D:
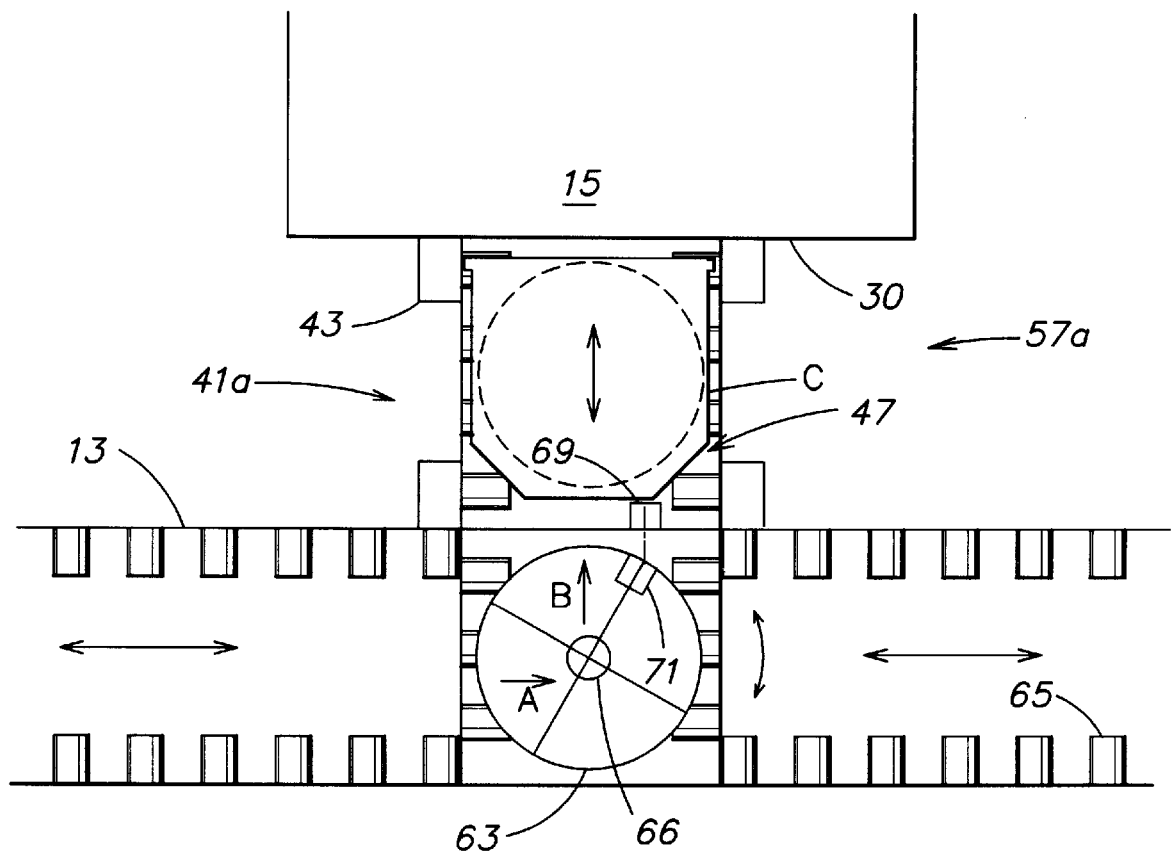

The turntable portion 63 rotates 90 degrees to the "transfer conveyor coupling position" so as to align the rolling elements 65 of the turntable portion 63 with the rolling elements 45 of the inventive loader conveyor 41a as shown in FIG. 3C. When the turntable portion 63 rotates, the wafer carrier C in place thereon and the receiver 71, coupled thereto also rotate 90 degrees such that the receiver 71 receives the signal from the emitter 69. In this position, the wafer carrier door 75 is in a position facing the wafer carrier door receiver 73 of the load port 27. After the receiver 71 receives the signal from the emitter 69, indicating that the rolling elements 65, 45 of the transfer conveyor 41a and of the inventive loader conveyor 41a are aligned, the rolling elements 65 of the turntable portion 63 are energized, and transfer the wafer carrier C to the inventive loader conveyor 41a such that the wafer carrier door 75 thereof is received in and aligned with the load port 27. FIG. 3D shows the wafer carrier C on the inventive loader conveyor 41a. The rolling elements 45 of the inventive loader conveyor 41a eventually transport the wafer carrier C to the intersection 30 of the processing system 15, wherein the interface wafer handler 37 may extract wafers from the wafer carrier C and may transport the wafers to the processing tool 18 as is conventionally known. After all the wafers have been processed, the inventive conveyor or loader reverses the steps described above and the wafer carrier is thereby returned to the transfer conveyor 13 for transport to another processing tool.

Thus, as is evident from the above description, the inventive conveyor load port 57a, having the inventive loader conveyor 41a, eliminates the need for the front-end loader robot 25 (FIG. 1) which, in turn, reduces equipment expense and increases equipment reliability.

Figure 4A:
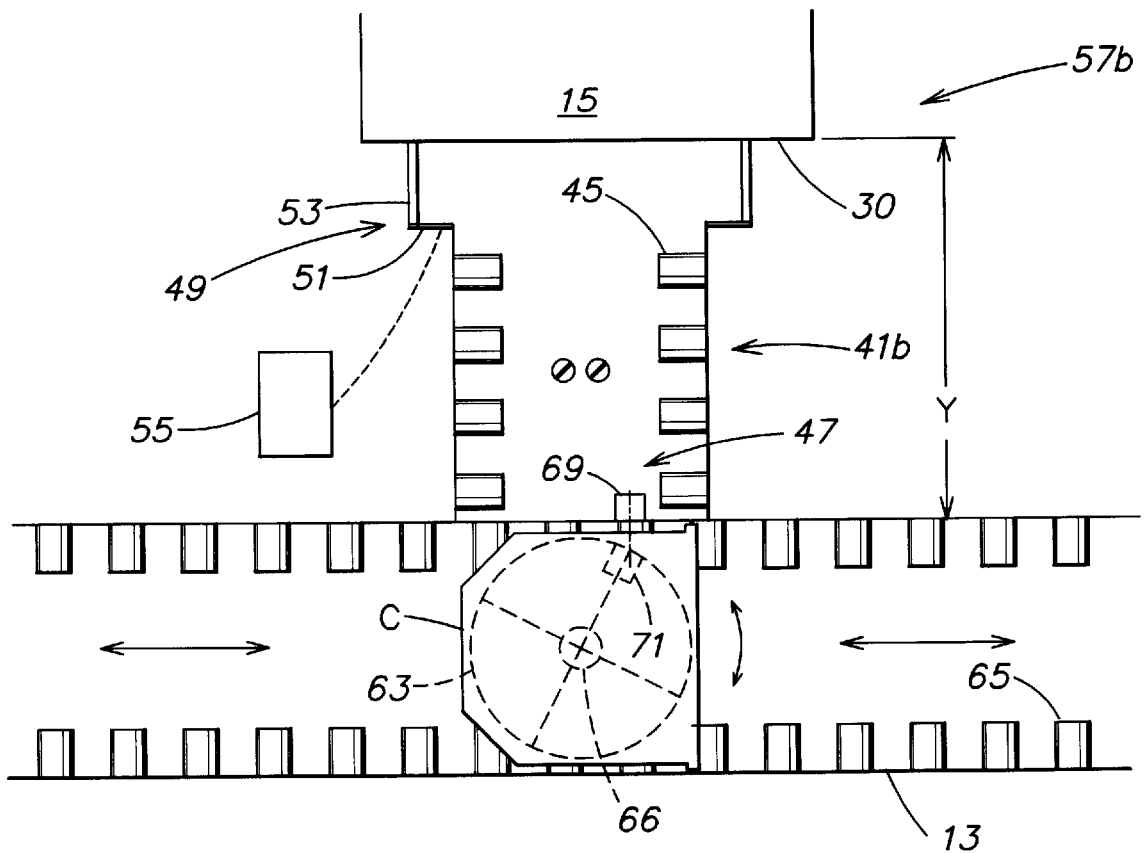
FIGS. 4A–C are schematic top plan views of a second embodiment of an inventive conveyor load port, having the inventive loader conveyor of FIG. 2B coupled thereto and adapted so as to receive a wafer carrier from a transfer conveyor and transfer the wafer carrier to an intersection with a processing system, wherein the interface wafer handler may extract wafers from the wafer carrier and transport the wafers to the processing tool.
Figure 4B:
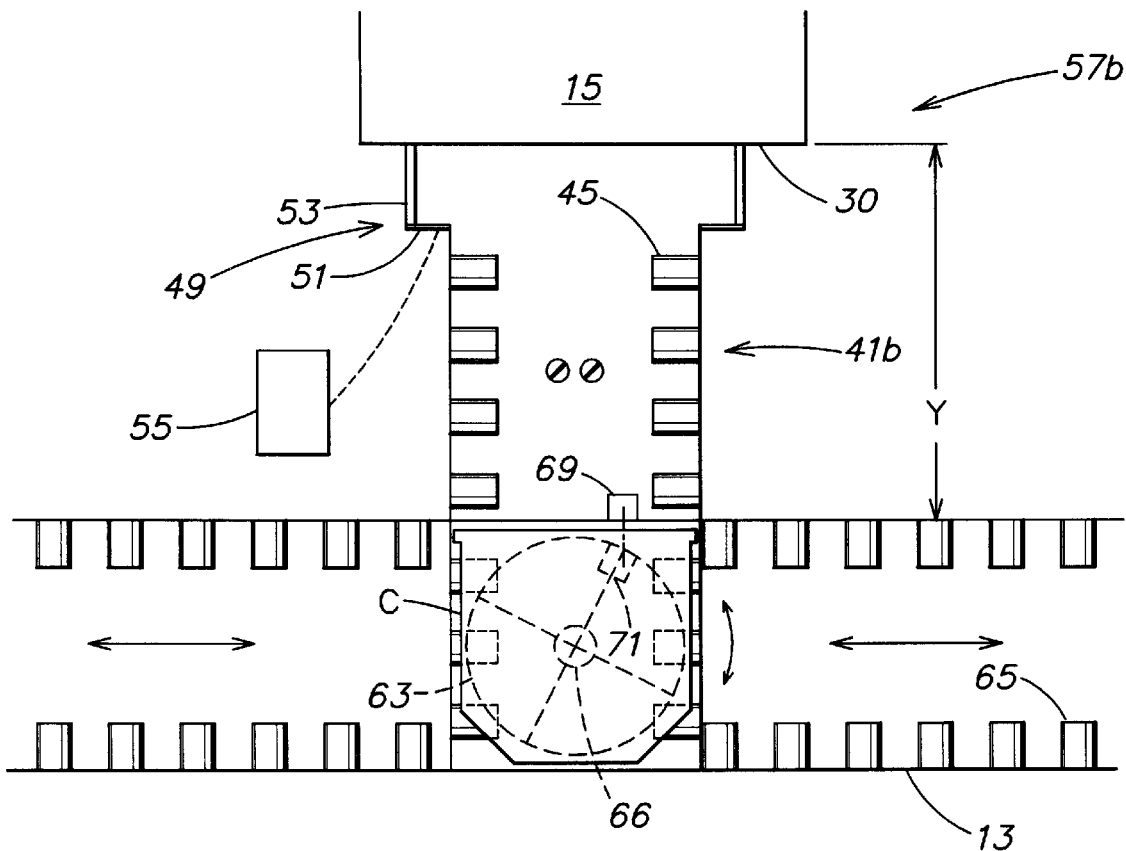
Figure 4C:
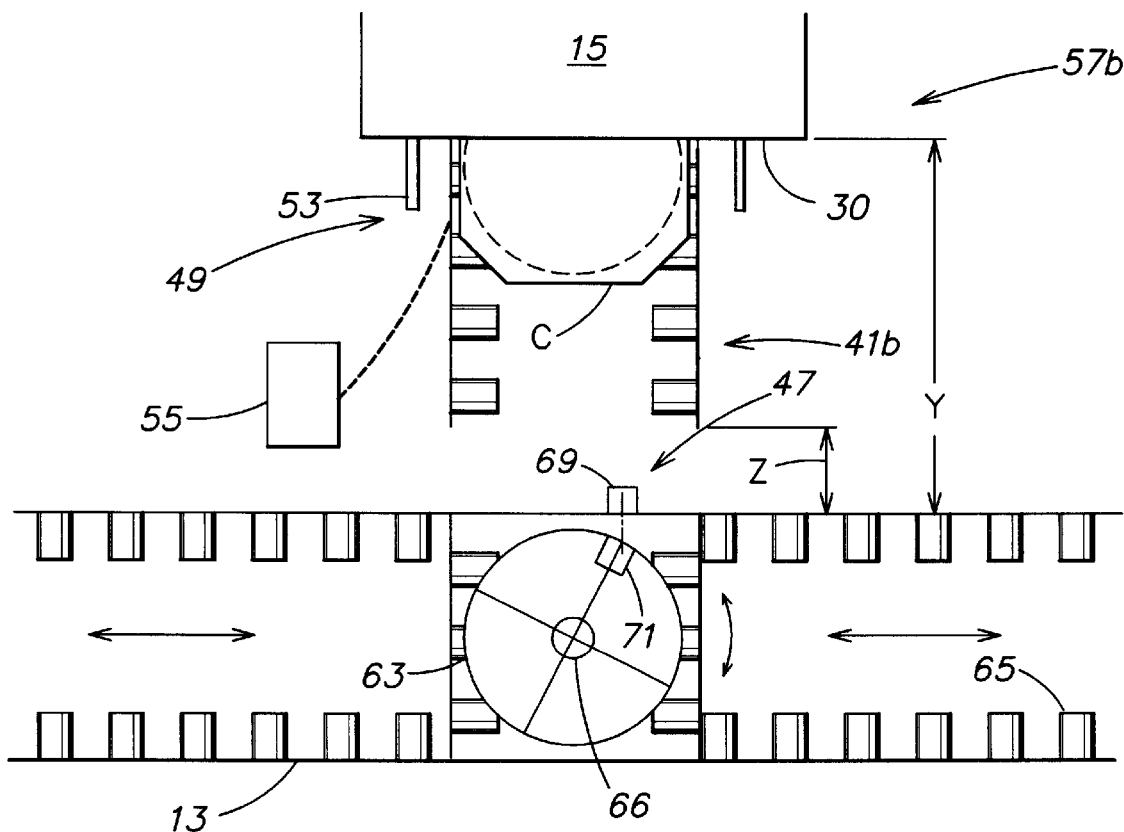

FIGS. 4A–C are schematic top plan views of a second embodiment of an inventive conveyor load port 57b, having the inventive loader conveyor 41b of FIG. 2B coupled thereto and adapted so as to receive a wafer carrier C from a transfer conveyor 13 and transfer the wafer carrier C to an intersection 30 with a processing system 15, wherein the interface wafer handler 37 (FIG. 1) may extract wafers from the wafer carrier C and transport the wafers to the processing tool 18. The inventive conveyor load port 57b is coupled to the transfer conveyor 13, preferably via the connecting mechanisms 43 or via being positioned sufficiently close to the transfer conveyor 13 so as to exchange wafer carriers C therewith, and terminates at the intersection 30 with the processing system 15.

The inventive conveyor load port 57b may comprise the same components as the inventive conveyor load port 57a of FIGS. 3A–D with the addition of the extension mechanism 49 which is adapted to selectively extend and retract so as to receive a wafer carrier C from the transfer conveyor 13 and transfer the wafer carrier C to the intersection 30 with the processing system 15 and/or so as to provide space, as represented by the distance Z, between the transfer conveyor 13 and the inventive conveyor load port 57b as needed for human access, for maintenance or for any other purpose.

As previously stated with reference to FIG. 2B, the extension mechanism 49 comprises the pair of arms 51, each arm 51 is slideably coupled to the track 53. In a "retracted position," the arms slideably retract along the track 53 toward the intersection 30 of the processing system 15. The controller 55 is coupled to the pair of arms 51 for controlling the extension and retraction thereof.

The operation of the inventive conveyor load port 57b, having the inventive loader conveyor 41b of FIG. 2B, is described with reference to the sequential views of FIGS. 4A–C, which show the movement of the wafer carrier C between the turntable portion 63 of the transfer conveyor 13 and the intersection 30 with the processing system 15. FIG. 4A shows the turntable portion 63 in the "initial" position and the wafer carrier C in place thereon. As previously described, in the "initial" position, the receiver 71 does not receive the signal from the emitter 69. The arms 51 of the extension mechanism 49 are extended as shown in FIG. 4A such that the inventive loader conveyor 41b is coupled to the transfer conveyor 13.

The turntable portion 63 rotates 90 degrees to the "transfer conveyor coupling position" so as to align the rolling elements 65 of the turntable portion 63 with the rolling elements 45 of the inventive loader conveyor 41b as shown in FIG. 4B. When the turntable portion 63 rotates, the wafer carrier C thereon and the receiver 71 also rotate 90 degrees, to a position wherein the receiver 71 receives the signal emitted by the emitter 69. The controller 55 then energizes the rolling elements 65 of the turntable portion 63, which in turn transfer the wafer carrier C to the inventive loader conveyor 41b.

The rolling elements 45 of the inventive loader conveyor 41b may transfer the wafer carrier C toward the arms intersection 30 while the controller 55 sends a signal to the arms 51, causing the arms 51 to slideably retract along the track 53 toward the intersection 30. Accordingly, the arms 51 assume the "retracted position" which, in turn, places the wafer carrier C adjacent the intersection 30 of the processing system 15 as shown in FIG. 4C. At the intersection 30 of the processing system 15, the interface wafer handler 37 (FIG. 1) extracts wafers from the wafer carrier C and transports the wafers to the processing tool 18. After all the wafers have been processed, the inventive conveyor or loader reverses the steps described above and the wafer carrier is thereby returned to the transfer conveyor 13 for transport to another processing tool.

Like the inventive conveyor load port 57a, the inventive conveyor load port 57b, also eliminates the need for the front-end loader robot 25 (FIG. 1) which, in turn, reduces equipment expense and increases equipment reliability.

FIGS. 5A–D are cross-sectional views of either the inventive conveyor load port 57a, 57b of FIGS. 3A–D or of FIGS. 4A–C, having an optional wafer carrier door receiver 73 adapted to engage and unlatch a door portion 75 (i.e., wafer carrier door 75) of a sealed wafer carrier 77. A sealed wafer carrier 77 is shown positioned on optional alignment pins 79 to ensure proper positioning on the inventive loader conveyor 41a, 41b.

The wafer carrier door receiver 73 defines a recess 81 into which a wafer carrier door 75 is received (e.g., when the inventive loader conveyor 41a, 41b transports the sealed wafer carrier 77 therealong so that the wafer carrier door 75 enters the recess 81). The recess 81 is defined by a plate 83 and a wall 85. The plate 83 of the recess 81 includes a sealed wafer carrier key actuating mechanism 87 which is connected to a key 89 and to a pneumatic actuator (not shown) adapted to unlatch the wafer carrier door 75 from the remainder of the sealed wafer carrier 77. Alignment pins 91 are also provided on the plate 83 for aligning the wafer carrier door 75 with the wafer carrier door receiver 73 such that the key 89 enters a corresponding keyhole (not shown) on the wafer carrier door 75.

A vertical actuator (not shown) is positioned below the inventive conveyor load port 57a, 57b and coupled to the wafer carrier door receiver 73 so as to move the wafer carrier door receiver 73 vertically downward until the opening 35 in the interface wall 29 is cleared as described below.

Figure 5A:
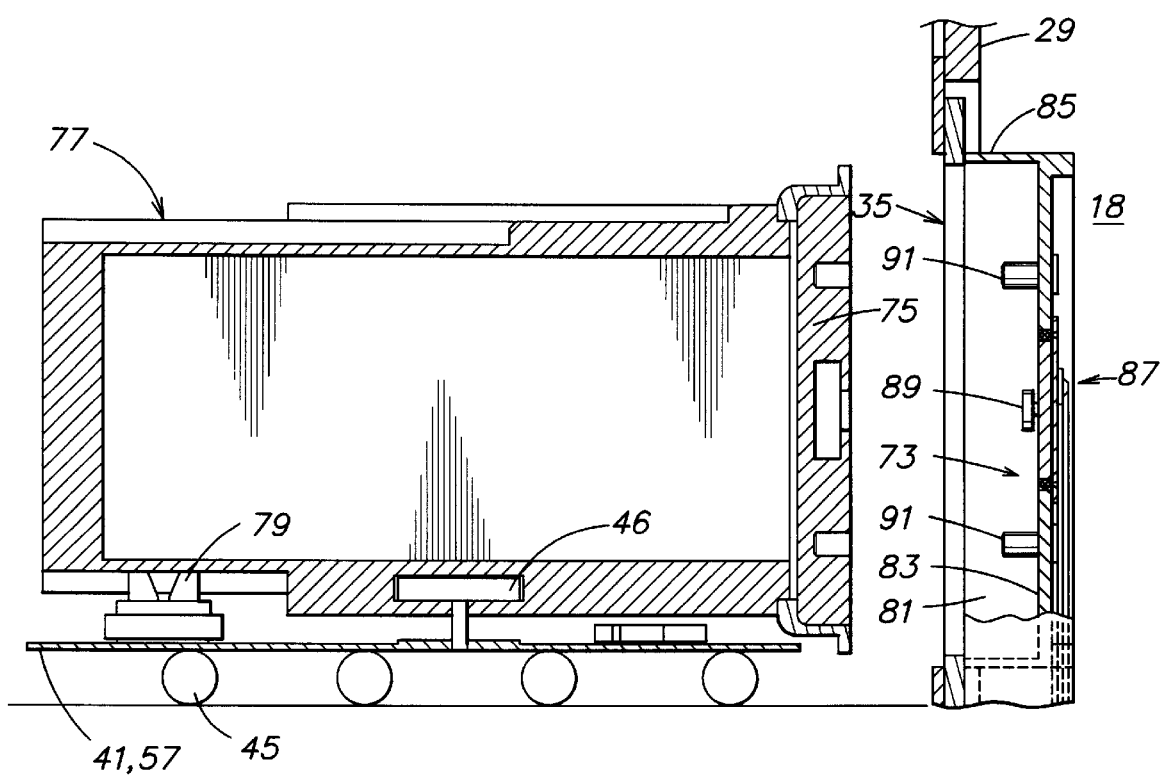
FIGS. 5A–D are cross-sectional views of either the inventive conveyor load port of FIGS. 3A–D or of FIGS. 4A–C, having an optional wafer carrier door receiver adapted to engage and unlatch a door portion (i.e., wafer carrier door) of a sealed wafer carrier.
Figure 5B:
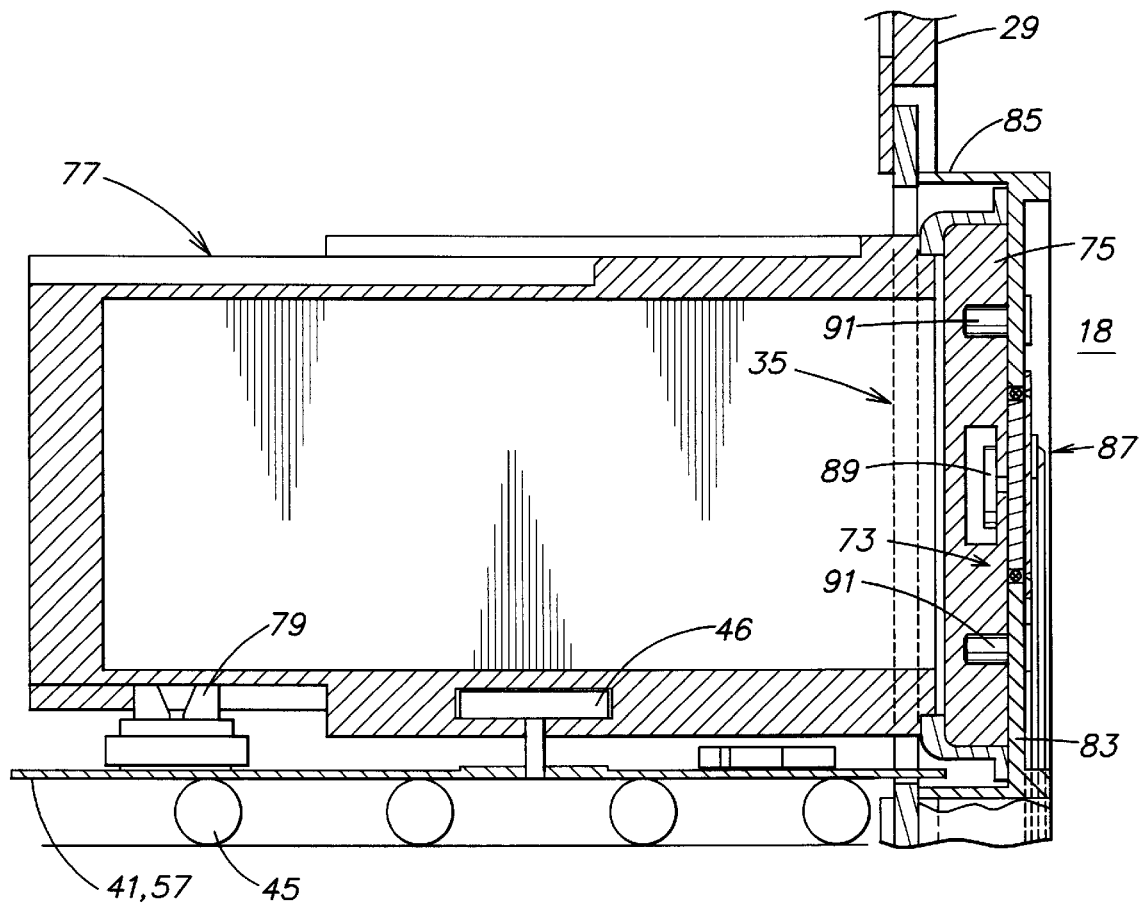

The operation of the inventive conveyor load port 57a, 57b is described with reference to the sequential views of FIGS. 5A–D, which show the movement of the sealed wafer carrier 77. FIG. 5A shows the sealed wafer carrier 77 positioned on the inventive conveyor load port 57a, 57b. The inventive conveyor load port 57a, 57b, via the rolling elements 45, moves the sealed wafer carrier 77 into the recess 81 of the wafer carrier door receiver 73 wherein the wafer carrier door 75 engages the wafer carrier door receiver 73 as shown in FIG. 5B.

Figure 5C:
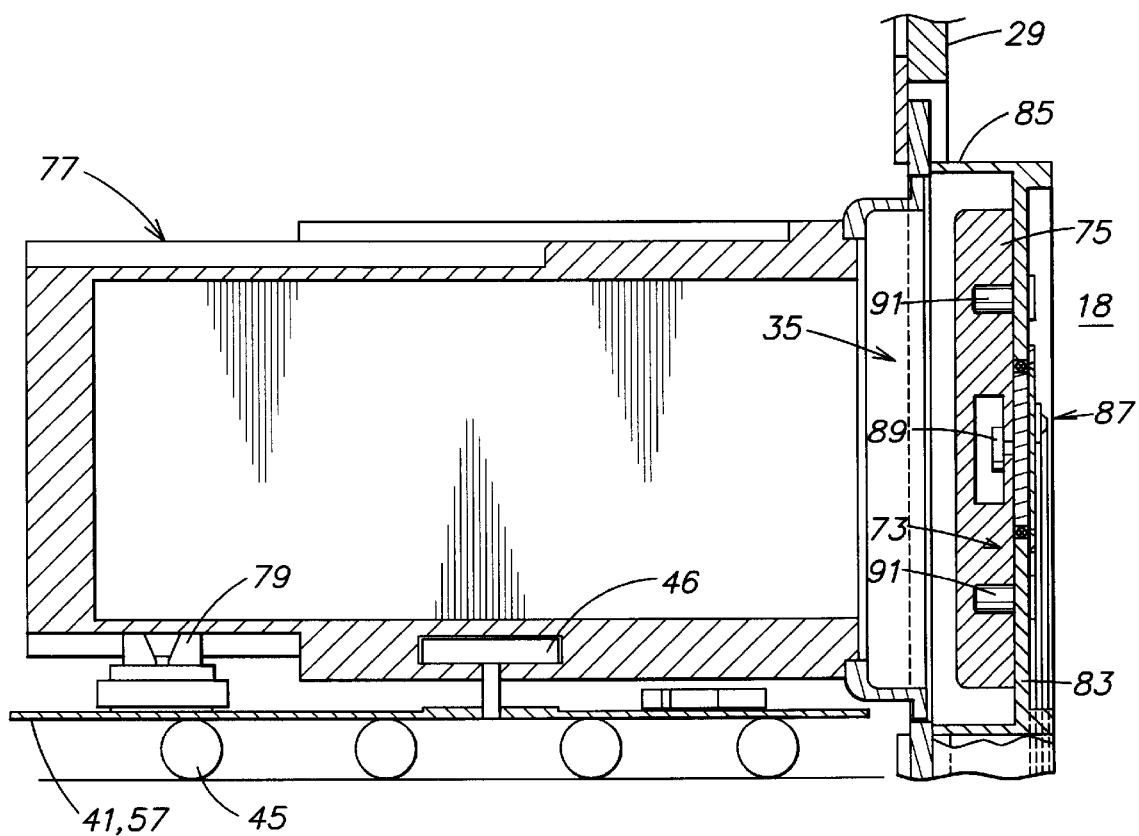
Figure 5D:
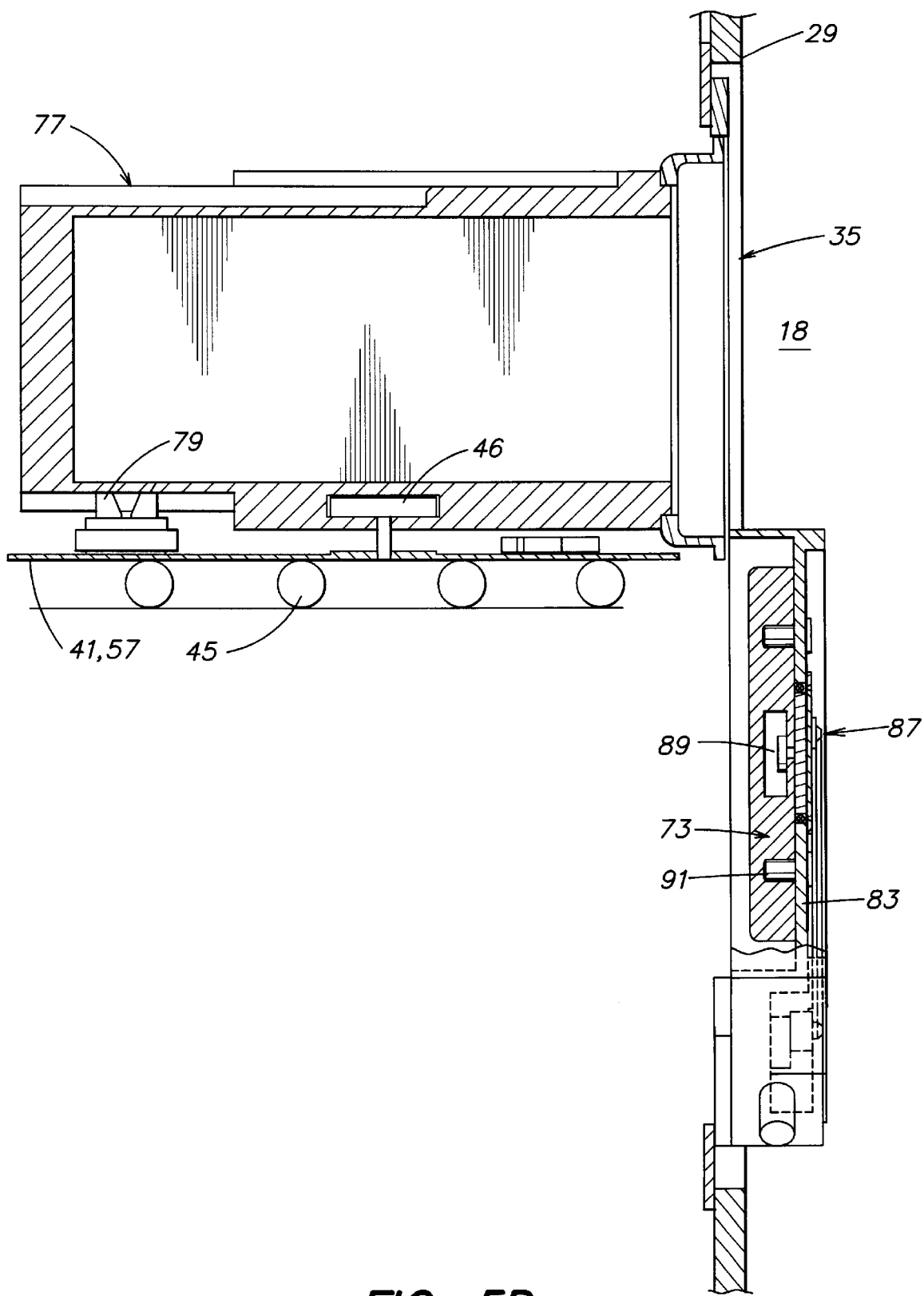

The alignment pins 79 on the wafer carrier door receiver 73 ensure proper alignment of the wafer carrier door 75 such that the key 89 engages the keyhole (not shown). A pneumatic actuator (not shown), then activates the sealed wafer carrier key actuating mechanism 87, which, in turn, rotates the key 89 to unlatch the wafer carrier door 75. The body of the wafer carrier 77 is then moved, via reverse actuation of the rolling elements 45, away from the wafer carrier door 75 as shown in FIG. 5C, so that the wafer carrier door 75 will not slide there against.

A vertical actuator (not shown) moves the wafer carrier door receiver 73 and the wafer carrier door 75 coupled thereto, vertically downward until the opening 35 in the interface wall 29 is cleared which enables the interface wafer handler 37 (FIG. 1) to extract wafers from the open wafer carrier 77 and to transport the wafers to the processing tool 18.

The inventive conveyor load port may thus provide an advantage over conventional systems. Conventionally, at the load port 27 (FIG. 1), a sealed wafer carrier 77 is placed on a translating platform (not shown) which is coupled to a horizontal actuator (not shown) for moving the translating platform, which, in turn, moves the sealed wafer carrier 77 in place thereon toward the wafer carrier door receiver 77. The inventive conveyor load port 57a, 57b, via the rolling elements 45, eliminates the need for the translating platform and the horizontal actuator, which may in turn reduce equipment expense and increase equipment reliability.

The foregoing description discloses only the preferred embodiments of the invention, modifications of the above disclosed apparatus and method which fall within the scope of the invention will be readily apparent to those of ordinary skill in the art. For instance, the processing system 15 may comprise any system wherein a processing, cleaning or measurement step etc. is eventually performed on a semiconductor substrate. The inventive conveyor load port 57a, 57b may function with any equipment in the FAB that requires a mechanism which supports a wafer carrier while wafers are extracted from the wafer carrier and transported into a processing system. Further, although the emitter 69 is shown coupled to the inventive loader conveyor 41a, 41b and the receiver 71 is shown coupled to the transfer conveyor 13, the emitter may be coupled to the transfer conveyor 13 and the receiver 71 may be coupled to the inventive loader conveyor 41a, 41b.

Accordingly, while the present invention has been disclosed in connection with the preferred embodiments thereof, it should be understood that there may be other embodiments which fall within the spirit and scope of the invention, as defined by the following claims.

The invention claimed is:

1. A method of transferring a wafer carrier to a processing system, comprising:
   providing a loader conveyor adapted to convey a wafer carrier in a first direction toward a processing system;
   providing a transfer conveyor having a turntable portion and being adapted to convey the wafer carrier in a second direction that differs from the first direction;
   rotating the turntable portion of the transfer conveyor to operatively align the turntable portion with the loader conveyor;
   conveying a wafer carrier from the turntable portion onto the loader conveyor; and
   using the loader conveyor to convey the wafer carrier to an intersection between the loader conveyor and the processing system.

2. The method of claim 1 further comprising:
   extending the loader conveyor until the loader conveyor contacts the transfer conveyor.

3. The method of claim 2 further comprising:
   retracting the loader conveyor from contact with the transfer conveyor.

4. The method of claim 1 further comprising:
   extracting wafers from the wafer carrier after the wafer carrier reaches the intersection.

5. The method of claim 4 further comprising:
   locking the wafer carrier in place at the intersection.

6. An apparatus, comprising
   a first conveyor adapted to convey a wafer carrier in a first direction toward a processing system; and
   a second conveyor adapted to convey the wafer carrier in a second direction that differs from the first direction, wherein the second conveyor includes a turntable portion, the turntable portion being rotatable between a first position in which the turntable portion is adapted to convey the wafer carrier in the second direction and a second position in which the turntable portion is adapted to convey the wafer carrier in the first direction, and wherein the turntable portion is coupled to the second conveyor.

7. The apparatus of claim 6, further comprising a sensor for indicating when the turntable portion is in the second position.

8. The apparatus of claim 7, wherein the sensor includes an emitter mounted on the first conveyor and a receiver mounted on the turntable portion.

9. The apparatus of claim 7, wherein the sensor includes an emitter mounted on the turntable portion and a receiver mounted on the first conveyor.

10. The apparatus of claim 6, wherein the second direction is perpendicular to the first direction.

* * * * *